(12) United States Patent
Ross

(10) Patent No.: US 6,551,926 B1
(45) Date of Patent: Apr. 22, 2003

(54) ELECTRON BEAM ANNEALING OF METALS, ALLOYS, NITRIDES AND SILICIDES

(75) Inventor: Matthew F. Ross, La Jolla, CA (US)

(73) Assignee: Electron Vision Corporation, San Diego, CA (US)

( * ) Notice: Subject to any disclaimer, the term of this patent is extended or adjusted under 35 U.S.C. 154(b) by 33 days.

(21) Appl. No.: 09/590,067

(22) Filed: Jun. 8, 2000

Related U.S. Application Data

(60) Provisional application No. 60/138,233, filed on Jun. 9, 1999.

(51) Int. Cl.[7] ............................................. H01L 21/44
(52) U.S. Cl. ........................................ 438/660; 438/687
(58) Field of Search ............................... 438/660, 687

(56) References Cited

U.S. PATENT DOCUMENTS

| | | | | |
|---|---|---|---|---|
| 5,003,178 A | * | 3/1991 | Livesay | 250/492 |
| 6,110,819 A | * | 8/2000 | Colgan et al. | 438/625 |
| 6,121,141 A | * | 9/2000 | Woo et al. | 438/687 |
| 6,147,000 A | * | 11/2000 | You et al. | 438/697 |
| 6,195,246 B1 | * | 2/2001 | Livesay et al. | 361/234 |
| 6,214,748 B1 | * | 4/2001 | Kobayashi et al. | 438/782 |
| 6,281,102 B1 | * | 8/2001 | Cao et al. | 438/592 |
| 6,281,110 B1 | * | 8/2001 | Kizilyalli et al. | 438/622 |

FOREIGN PATENT DOCUMENTS

| | | | | |
|---|---|---|---|---|
| GB | 2 080 620 A | * | 2/1982 | |
| JP | 62040722 | * | 2/1987 | H01L/21/26 |

* cited by examiner

*Primary Examiner*—Carl Whitehead, Jr.
*Assistant Examiner*—David S Blum
(74) *Attorney, Agent, or Firm*—Roberts & Mercanti, LLP

(57) ABSTRACT

A process for the formation of structures in microelectronic devices such as integrated circuit devices wherein a patterned layer of a metal, alloy, nitride or silicide is subjected to a low temperature, wide beam electron beam annealing. The process involves depositing a silicide, nitride, metal, or metal alloy layer onto a substrate; and then overall flood exposing said entire layer to electron beam radiation under conditions sufficient to anneal the layer.

16 Claims, No Drawings

ELECTRON BEAM ANNEALING OF METALS, ALLOYS, NITRIDES AND SILICIDES

CROSS REFERENCE TO RELATED APPLICATION

This application claims the benefit of provisional application Ser. No. 60/138,233 filed Jun. 9, 1999 which is incorporated herein by reference.

BACKGROUND OF THE INVENTION

1. Field of the Invention

The present invention relates to the annealing of metals, alloys, and nitrides via electron beam irradiation. More particularly, the invention relates to low temperature, wide beam electron beam annealing of layers useful in the production of microelectronic devices.

2. Description of the Related Art

In the fabrication of microelectronic devices such as semiconductor devices, it is desirable to thermally anneal the film layers which are incorporated into such devices. This annealing step insures a layer having improved electrical and mechanical properties. That is, the material has desired low internal stress and strength characteristics and these characteristics are uniform and consistent throughout the film layer by modifying the grain structure and orientation.

It is conventional to deposit layers on a semiconductor substrate, to pattern the layers and thereafter to thermally anneal the patterned layer. For some uses, metals are annealed prior to patterning. The foregoing thermal method of layer formation has a variety of disadvantages, principally because the thermal annealing process must carried out at relatively high temperatures, generally around 850° to 1100° C. Treatment at such high temperatures may have a detrimental impact on other portions of the microelectronic device. In these other annealing techniques, the heating must be done for extended periods of time, for example up to sixty minutes. This results in a reduction of device throughput during production. It is known to anneal portions of a microelectronic device using electron beam exposure. However, such uses have been for exposing a localized portion of the device rather than for a full surface treatment. It would therefore be desirable to have a method of forming patterned, annealed layers on semiconductor substrates at reduced temperatures, and at reduced manufacturing time.

It has now been found that a thin film microelectronic device which has excellent characteristics and a fine crystal grain size can be produced by a wide beam electron beam annealing with the treatment temperatures being kept low. Therefore, fine semiconductor devices can be easily produced. Accordingly, the present invention produces high-performance thin film microelectronic devices at low cost and in high yield.

SUMMARY OF THE INVENTION

The invention provides a process for annealing a thin layer which comprises:
(a) depositing a nitride, metal, or metal alloy layer onto a substrate; and
(b) overall flood exposing said entire layer to electron beam radiation under conditions sufficient to anneal the layer.

The invention also provides a microelectronic device which comprises a substrate; a silicide, nitride, metal, or metal alloy layer on the substrate, the entirety of which layer has been overall flood exposed to electron beam radiation under conditions sufficient to anneal the layer.

DETAILED DESCRIPTION OF THE PREFERRED EMBODIMENT

As a first step in conducting the process according to the invention, a nitride, metal or metal alloy is deposited onto a substrate to form a pre-annealed layer. Typical substrates include those suitable to be processed into an integrated circuit or other microelectronic device. Suitable substrates for the present invention non-exclusively include semiconductor materials such as gallium arsenide (GaAs), germanium, silicon, silicon germanium, lithium niobate and compositions containing silicon such as crystalline silicon, polysilicon, amorphous silicon, epitaxial silicon, and silicon dioxide ($SiO_2$) and mixtures thereof.

Deposition of the nitride, metal, or metal alloy can be accomplished using well known methods in the art. Preferred methods of applying the nitride, silicide, metal, or alloy include PVD, CVD, sputtering, and evaporation methods.

A preferred nitride is TiN. A silicide is formed by depositing a metal on silicon and annealing the combination to form a metal silicon alloy or silicide. The silicides of the present invention can be any compound of two elements, one of which is silicon and the other a metal. However, preferred silicides include TiSi, CoSi, PtSi, NiSi. Preferred metals include aluminum, aluminum alloys, copper, copper alloys, tantalum, tungsten, titanium or other metal typically employed in the formation of microelectronic devices, and alloys thereof. Any alloy can be included as part of the present invention, however, preferred alloys include Al—Cu. The thickness of the layer is preferably from about 500 Å to about 50,000 Å, and preferably from about 2000 Å to about 12000 Å and more preferably from about 3000 Å to about 5000 Å.

In the preferred embodiment, the deposited layer is unpatterned. In certain instances the material may be patterned. In such a case the deposited layer is then imagewise patterned by standard lithographic techniques. This may be done by forming a photoresist image on the deposited layer on the substrate and then removing portions of the layer by etching. In this technique, the deposited layer is coated with a photoresist composition. The photoresist layer is then imagewise exposed to actinic radiation and developed. Photoresist compositions are themselves well known in the art and are widely commercially available. Positive working photoresists include compositions or polymers that can be solubilized or degraded as a result of irradiation with an electron beam or actinic radiation. Suitable photoresist compositions may include mixtures of o-quinone diazides with an aqueous alkali soluble or swellable binder resin such as a novolak or poly(4-hydroxystyrene). Suitable photoresists are described in U.S. Pat. Nos. 4,692,398; 4,835,086; 4,863,827 and 4,892,801. Suitable photoresists may be purchased commercially as AZ-4620, from Clariant Corporation of Somerville, N.J. Other suitable photoresists include solutions of polymethylmethacrylate (PMMA), such as a liquid photoresist available as 496 k PMMA, from OLIN HUNT/OCG, West Paterson, N.J. 07424, comprising polymethylmethacrylate with molecular weight of 496,000 dissolved in chlorobenzene (9 wt %); P(MMA-MAA) (poly methyl methacrylate-methacrylic acid); PMMA/P(MMA-MAA) polymethylmethacrylate/(poly methyl methacrylate-methacrylic acid). The photoresist of the present invention may comprise any of these materials or analogous materials provided different the composition can be solubilized or degraded as a result of irradiation with an electron beam or actinic radiation.

In a preferred embodiment, the working photoresist composition preferably comprises a solution of a novolak resin, a quinone diazide photosensitizer, and a compatible solvent composition. The production of novolak resins is well known in the art and is more fully described in U.S. Pat. No. 4,692,398. Suitable quinone diazide photosensitizers include o-quinone diazides such as naphthoquinone diazide sensitizers which are conventionally used in the art in positive photoresist formulations. Useful naphthoquinone diazide sensitizers include naphthoquinone-(1,2)-diazide-5-sulfonyl chloride, and naphthoquinone-(1,2)-diazide-4-sulfonyl chloride condensed with compounds such as hydroxy benzophenones. These compounds are also more fully described in U.S. Pat. No. 4,692,398.

After deposition onto the deposited substrate, the photoresist is imagewise exposed, such as through a mask, to actinic radiation. This exposure renders the photoresist layer more soluble after exposure than prior to exposure. The amount of actinic radiation used is an amount sufficient to render the exposed portions of the photoresist layer imagewise soluble in a suitable developer. Actinic radiation such as UV (ultraviolet), laser, writing e-beam, x radiation, etc., may be employed in the present invention. Preferably, UV radiation is used in an amount and at a wavelength sufficient to render the exposed portions of the photoresist layer imagewise soluble in a suitable developer. UV exposure doses of from about 100 mJ/cm$^2$ to about 300 mJ/cm$^2$ are usually sufficient.

Suitable developers for novolak resin/diazide photoresist are aqueous alkaline solutions Typical examples of the aqueous alkaline solutions suitable as the developer include sodium hydroxide, tetramethylammonium hydroxide, or aqueous solutions of hydroxides of metals belonging to the groups I and II of the periodic table such as potassium hydroxide or an aqueous solution of organic bases free from metal ions such as tetraalkylammonium hydroxide, for example, tetramethylammonium hydroxide (TMAH), tetraethylammonium hydroxide (TEAH) and tetrabutylammonium hydroxide (TBAH). More preferably, tetramethylammonium hydroxide (TMAH) can be used as the developer. Furthermore, if desired, the aqueous basic solution used as the developer may additionally contain any additives such as a surface active agent in order to improve the resulting development effect. Examples of an aqueous alkaline developer include AZ 400K alkaline developer or AZ 312 MIF alkaline developer available from Clariant Corporation of Somerville, N.J. Suitable developer for acrylate photoresists such as PMMA photoresists include methylisobutyl ketone and xylene. The development procedure may comprise of any conventional method such as immersion in the aforementioned developer and agitation with nitrogen bursts.

Once formed, the patterned film is exposed to electron beam irradiation under conditions sufficient to form an annealed film. Electron beam radiation may take place in any chamber having a means for providing electron beam radiation to substrates placed therein. It is preferred that the electron beam exposing step is conducted with a wide, large beam of electron radiation from a large-area electron beam source. Preferably, an electron beam chamber is used which provides a large area electron source. Suitable electron beam chambers are commercially available from Electron Vision Corporation of San Diego, Calif., under the trade name "ElectronCure™". The principles of operation and performance characteristics of such device are described in U.S. Pat. No. 5,003,178, the disclosure of which is incorporated herein by reference. The temperature of the electron beam exposure preferably ranges from about 200° C. to about 600° C., more preferably from about 250° C. to about 450° C. The electron beam energy is preferably from about 0.5 KeV to about 30 KeV, and more preferably from about 3 to about 10 KeV. The dose of electrons is preferably from about 1 to about 50,000 $\mu$C/cm$^2$ and more preferably from about 50 to about 20,000 $\mu$C/cm$^2$. Generally, it is preferred that the exposing step is carried out at a pressure of from about 1 m Torr to about 100 m Torr. Electron beam exposure may be controlled by setting the beam acceleration. The electron beam radiation is controlled such that the electrons range is concentrated at a plane between the upper and lower surfaces of the layer. The gas ambient in the electron beam tool can be any of the following gases: nitrogen, oxygen, hydrogen, argon, a blend of hydrogen and nitrogen, ammonia, xenon, forming gas or any combination of these gases. The electron beam current is preferably from about 1 to about 40 mA, and more preferably from about 5 to about 20 mA. Preferably, the electron beam exposing step is conducted with a wide, large beam of electron beam radiation from a uniform large-are electron beam source which covers an area of from about 4 inches to about 256 square inches.

This annealing process may be aided by heating the substrate, such as by heating the back side of the layered substrate at a temperature in the range of about 200° C. to about 600° C. over a period in the range of about 1 to about 30 minutes using quartz lamps.

Preferably the process is repeated wherein an additional layer of a silicide, nitride, metal, or metal alloy is deposited onto the prior annealed layer; and the additional layer is patterned and then overall flood exposed to electron beam radiation under conditions sufficient to anneal the additional layer.

The following non-limiting examples serve to illustrate the invention.

EXAMPLE 1

Si/Ti is CVD deposited onto a series of gallium arsenide substrates to a thickness of about 450Å. Each of the deposited layers are then lithographically patterned and exposed in an ElectronCure™ 30 chamber incorporating a large area electron source to electron beam irradiation at an energy level ranging from about 4–6 keV of energy at room temperature, 400° C., 500° C. and 600° C. using Ar as the process gas until the deposited layer is annealed. The annealed layers show acceptable low resistance properties for each of the deposited layers.

EXAMPLE 2

Example 1 is repeated except SiO$_2$/Ti is used instead of Si/Ti. The substrate shows acceptable low resistance properties for each of the deposited layers.

EXAMPLE 3

A stack structure of SiO$_2$/Ti/TiN/Al—Cu/TiN layers is applied to a series of silicon wafer substrates via sputter deposition to a thickness of about 6.5 kÅ. The deposited substrates are patterned and subjected to electron beam irradiation in an ElectronCure™ 30 chamber incorporating a large area electron source at an energy level ranging from about 8–12 keV of energy at room temperature, 200° C., 300° C. and 400° C. using Ar as the process gas. The deposited substrates exhibit good grain structure and orientation for each of the deposited layers. In addition, the substrates demonstrate both good low electrical resistance and low electromigration properties.

EXAMPLE 4

Ti is sputter deposited onto a series of SiO$_2$ substrates to a layer thickness of about 600Å. The deposited layers are patterned and subjected to electron beam irradiation in an ElectronCure™ 30 chamber incorporating a large area electron source at an energy level ranging from about 4–6 keV at room temperature, 400° C., 500° C. and 600° C. using N$_2$ as the process gas at a dose sufficient to convert Ti into TiN. The resulting treated substrates show satisfactory low electrical resistance properties for each of the temperatures indicated.

EXAMPLE 5

Ti and TiN are deposited via PVD onto a series of SiO$_2$ substrates and patterned. The substrates undergo electron beam irradiation in an ElectronCure™ 30 chamber incorporating a large area electron source at an energy level ranging from about 4–6 keV at room temperature, 400° C., 500° C. and 600° C. using N$_2$ as the process gas. The film stack has good satisfactory low electrical resistance properties for each of the temperatures.

EXAMPLE 6

Example 5 is repeated using CVD instead of PVD. The film stack has good satisfactory low electrical resistance properties for each of the temperatures.

EXAMPLE 7

A thin film of TiN is deposited onto a 4" silicon wafer using a conventional evaporation technique and then patterned. The film thickness is in the range of 800 to 1000 Å.

The deposited wafer is subjected to electron beam exposure in an ElectronCure™ 30 chamber incorporating a large area electron source and quartz lamps for heating the wafer. Curing is carried out at 425° C. for one hour. The cold-cathode source produced a large area electron beam (over 200 mm in diameter) having a substantially uniform emission over its entire surface. Electron emissions are controlled by the low bias voltage applied to the anode grid. Two different e-beam exposure conditions, low and high doses (3 and 10 mC/cm$^2$) at a fixed energy (8 KeV), are employed. The electron beam penetration depth at the electron energy of 8 KeV is about 1 μm. Thus, the entire film thickness is assumed to be irradiated by the electron beam. Electron beam exposure is conducted and in an argon atmosphere (10–30 milliTorr).

Room temperature stress measurements and stress-temperature cycling experiments are performed using a Tencor Flexus stress measurement system. Stress-temperature cycling experiments are conducted from room temperature to 500° C.; during the heating phase the temperature is raised 4° C. per minute; during the cooling phase the temperature decreased in an exponential fashion from 500° C. to room temperature over a period of 7 hours. T$_8$ is the temperature at which the film stress no longer changes with increasing temperature.

While the present invention has been particularly shown and described with reference to preferred embodiments, it will be readily appreciated by those of ordinary skill in the art that various changes and modifications may be made without departing from the spirit and scope of the invention. In particular, while the foregoing prophetic examples have employed certain materials, these are only exemplary and many others could be used as well. It is intended that the claims be to interpreted to cover the disclosed embodiments, those alternatives which have been discussed above and all equivalents thereto.

What is claimed is:

1. A process for annealing a thin layer which comprises:
   (a) depositing a nitride, metal, or metal alloy layer onto a substrate; and
   (b) overall flood exposing said entire layer to electron beam radiation under conditions sufficient to anneal the layer, wherein the electron beam current ranges from about 1 mA to about 40 mA.

2. The process of claim 1 wherein the nitride, metal, or metal alloy layer is patterned prior to electron beam radiation.

3. The process of claim 2 wherein an additional layer of a nitride, metal, or metal alloy is deposited onto the prior annealed layer; and the additional layer is patterned and then overall flood exposed to electron beam radiation under conditions sufficient to anneal the additional layer.

4. The process of claim 1 wherein said nitride comprises titanium nitride.

5. The process of claim 1 wherein said alloy comprises Al—Cu alloys.

6. The process of claim 1 wherein said metal comprises one or more materials selected from the group consisting of aluminum, aluminum alloys, copper, copper alloys, tantalum, tungsten, titanium, platinum, nickel and alloys thereof.

7. The process of claim 1 wherein said substrate comprises gallium arsenide, germanium, silicon, silicon germanium, lithium niobate, compositions containing silicon or combinations thereof.

8. The process of claim 1 wherein said exposing step is conducted at an energy level ranging from about 1 to about 30 KeV.

9. The process of claim 1 wherein said exposing step is conducted at an electron dose ranging from about 50 to about 50,000 μC/cm$^2$.

10. The process of claim 1 wherein said exposing step is conducted with a wide, large beam of electron beam radiation from a uniform large-area electron beam source which covers an area of from about 4 square inches to about 256 square inches.

11. The process of claim 1 which is carried out by heating the deposited substrate at a temperature of from about 200° to about 600° C.

12. The process of claim 1 which is carried out by heating the deposited substrate at a temperature of from about 200° to about 600° C. by heating means positioned behind the substrate.

13. The process of claim 1 wherein said exposing step is carried out under vacuum conditions.

14. The process of claim 1 wherein said exposing step is carried out at a pressure of from about 1 m Torr to about 100 m Torr.

15. The process of claim 1 wherein said exposing step is carried out with a process gas selected from the group consisting of nitrogen, oxygen, hydrogen, argon, a blend of hydrogen and nitrogen, ammonia, xenon, forming gas or any combination thereof.

16. The process of claim 1 wherein said layer is deposited by PVD, CVD, sputtering, or evaporation.

* * * * *